(12) United States Patent
Lingunis et al.

(10) Patent No.: US 6,958,272 B2
(45) Date of Patent: Oct. 25, 2005

(54) POCKET IMPLANT FOR COMPLEMENTARY BIT DISTURB IMPROVEMENT AND CHARGING IMPROVEMENT OF SONOS MEMORY CELL

(75) Inventors: Emmanuil H. Lingunis, San Jose, CA (US); Nga-Ching Alan Wong, San Jose, CA (US); Sameer Haddad, San Jose, CA (US); Mark W. Randolph, San Jose, CA (US); Mark T. Ramsbey, Sunnyvale, CA (US); Ashot Melik-Martirosian, Santa Clara, CA (US); Edward F. Runnion, Santa Clara, CA (US); Yi He, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 10/755,740

(22) Filed: Jan. 12, 2004

(65) Prior Publication Data
US 2005/0153508 A1    Jul. 14, 2005

(51) Int. Cl.$^7$ ............................................ H01L 21/336
(52) U.S. Cl. ...................... 438/257; 438/593; 438/959
(58) Field of Search ............................. 438/257, 266, 438/551, 593, 663, 706, 745, 770, 773, 954, 438/959

(56) References Cited

U.S. PATENT DOCUMENTS

| | | | |
|---|---|---|---|
| 6,215,148 B1 | 4/2001 | Eitan | |
| 6,383,952 B1 | 5/2002 | Subramanian et al. | |
| 6,410,388 B1 | 6/2002 | Kluth et al. | |
| 6,436,768 B1 * | 8/2002 | Yang et al. | 438/266 |
| 6,440,797 B1 | 8/2002 | Wu et al. | |
| 6,465,303 B1 | 10/2002 | Ramsbey et al. | |
| 6,477,084 B1 | 11/2002 | Eitan | |
| 6,479,348 B1 | 11/2002 | Kamal et al. | |
| 6,492,670 B1 | 12/2002 | Yu | |
| 6,500,713 B1 * | 12/2002 | Ramsbey et al. | 438/258 |
| 6,524,913 B1 | 2/2003 | Lin et al. | |
| 6,566,194 B1 | 5/2003 | Ramsbey et al. | |
| 6,573,140 B1 | 6/2003 | Ogura et al. | |
| 6,590,811 B1 | 7/2003 | Hamilton et al. | |
| 6,617,215 B1 | 9/2003 | Halliyal et al. | |
| 6,620,717 B1 * | 9/2003 | Kamal et al. | 438/587 |

(Continued)

OTHER PUBLICATIONS

Solid Sate Technology's WaferNEWS, The Semiconductor Equipment and Materials Weekly Briefing, Mar. 17, 2003, V10n22, 11 pgs.

*Primary Examiner*—Phuc T. Dang
(74) *Attorney, Agent, or Firm*—Eschweiler & Associates, LLC

(57) ABSTRACT

A technique for forming at least part of an array of a dual bit memory core is disclosed. Initially, a portion of a charge trapping dielectric layer is formed over a substrate and a resist is formed over the portion of the charge trapping dielectric layer. The resist is patterned and a pocket implant is performed at an angle to establish pocket implants within the substrate. A bitline implant is then performed to establish buried bitlines within the substrate. The patterned resist is then removed and the remainder of the charge trapping dielectric layer is formed. A wordline material is formed over the remainder of the charge trapping dielectric layer and patterned to form wordlines that overlie the bitlines. The pocket implants serve to mitigate, among other things, complementary bit disturb (CBD) that can result from semiconductor scaling. As such, semiconductor devices can be made smaller and increased packing densities can be achieved by virtue of the inventive concepts set forth herein.

23 Claims, 8 Drawing Sheets

U.S. PATENT DOCUMENTS 6,630,384 B1   10/2003  Sun et al.
6,653,190 B1   11/2003  Yang et al.

2002/0182829 A1 *  12/2002  Chen .......................... 438/514

* cited by examiner

US 6,958,272 B2

POCKET IMPLANT FOR COMPLEMENTARY BIT DISTURB IMPROVEMENT AND CHARGING IMPROVEMENT OF SONOS MEMORY CELL

FIELD OF INVENTION

The present invention relates generally to memory for computer systems and the like, and in particular to utilizing one or more pocket implants when fabricating a SONOS memory device so as to mitigate complementary bit disturb (CBD) and short channel length issues.

BACKGROUND OF THE INVENTION

A relatively modern technology in computer related memory is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

One arrangement that facilitates dual bit technology is a SONOS type architecture where a substrate, typically composed of silicon, generally has a layer of silicon oxide, a layer of silicon nitride, a layer of silicon oxide and finally a layer of conductive material (e.g., poly-silicon) formed there-over. Given the electrical properties of the nitride layer, charges trapped within the dual bit memory cell do not readily delocalize, and thus more than one bit can be stored within respective memory cells. The oxide-nitride-oxide (ONO) layers are thus together commonly referred to as a charge trapping dielectric layer.

Bitlines are implanted within the substrate under the charge trapping dielectric layer, and wordlines are formed over the charge trapping dielectric layer substantially perpendicular to the bitlines. In particular, the wordlines may be formed out of the layer of conductive material formed over the charge trapping dielectric ONO layer. Programming circuitry controls two bits per cell by applying a signal to the wordline, which acts as a control gate, and changing bitline connections such that one bit is stored by the source and drain being connected in one arrangement and a complementary bit is stored by the source and drain being interchanged in another arrangement.

Nevertheless, there is an ongoing desire to scale down semiconductor devices and to pack more devices having greater capabilities onto smaller and smaller areas. As device sizes and features are scaled down, however, certain disadvantageous issues can arise. By way of example, forming bitlines closer together shortens the length of respective channels defined there-between, which can lead to complementary bit disturb (CBD), among other things. For example, charge or bit isolation between the two bits stored in the charge trapping layer becomes increasingly difficult as the channel length is decreased and the bits are brought closer together. In this manner, the bits can contaminate one another and operations performed on one bit can affect the other bit. For instance, when one bit is programmed (e.g., to 1 unit of charge) the other (complementary) bit may also (unintentionally) receive a (slight) charge (e.g., to 0.5 units of charge). The charge on the un-programmed bit may make it difficult to isolate or differentiate between the two bits when performing a read operation of the charged bit, for example. Thus, it can be said that a window for reading the programmed cell is decreased, or rather that there is a decrease in a reading margin. In addition, short channel effects and leakage currents as well as other undesirable performance issues can also result scaling and shortened channel lengths.

Similarly, unwanted source/drain leakage conduction or punchthrough current can occur as channel lengths shorten. Punchthrough current may be seen as a parasitic current path existing between the drain and source, which the gate has difficulty in controlling since the current path is located deep in the bulk (substrate) far away from the gate. The actual amount of punchthrough current depends mainly upon the potential distribution under the channel and on the source/drain junction depths. As the effective channel length gets shorter, the source/drain depletion regions get closer together causing this leakage current component to increase. Accordingly, it would be desirable to reduce feature sizes so as to increase packing density while mitigating adverse affects that may result therefrom.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to utilizing pocket implants in fashioning a dual bit memory device. The pocket implants serve to mitigate, among other things, complementary bit disturb (CBD) thereby providing for device scaling and increased packing density. In this manner, bit separation is preserved and leakage currents, cross talk, as well as other adverse effects that can result from narrow channels are mitigated allowing the memory device to operate as desired.

According to one or more aspects of the present invention, a method of forming at least a portion of a SONOS dual bit memory core array upon a semiconductor substrate is disclosed. The method includes forming a portion of a charge trapping dielectric layer over the substrate and forming a resist over the portion of the charge trapping dielectric layer. The resist is then patterned to form a plurality of resist features having respective first spacings therebetween. A pocket implant is then performed through the first spacings and the portion of the charge trapping dielectric layer. The pocket implant is performed at an angle relative to the semiconductor substrate so as to establish pocket implants within the substrate that extend at least partially under the resist features. A bitline implant is then performed through the first spacings and the portion of the charge trapping dielectric layer to establish buried bitlines within the substrate having a width corresponding generally to the first spacing, and do not cover the portions of the pocket implants that extend under the resist features. The patterned resist is then removed and the remainder of the charge trapping dielectric layer is formed over the portion of the charge trapping dielectric layer. A wordline material is then formed over the remainder of the charge trapping dielectric layer and is patterned to form wordlines that overlie the bitlines.

The method is a substantially planar process in that no patterning is performed upon the charge trapping dielectric layer.

According to one or more other aspects of the present invention, a method of forming at least a portion of a SONOS dual bit memory core array upon a semiconductor substrate is disclosed. The method includes forming pocket implants within the substrate without patterning a first insulating layer overlying the substrate or a charge trapping layer overlying the first insulating layer. The pocket implants are implanted at least partially under features formed out a resist material overlying the charge trapping layer. The pocket implants are implanted through the first insulating layer, the charge trapping layer and first spacings formed between the resist features. The method also includes forming bitline implants through the first spacings to establish buried bitlines within the substrate having respective widths corresponding generally to the first spacings, where the bitlines do not cover the portions of the pocket implants that extend under the resist features. The method further includes removing the resist features, forming a second insulating layer over the charge trapping layer, forming a wordline material over the second insulating layer and patterning the wordline material to form wordlines that overlie the bitlines.

In accordance with one or more other aspects of the present invention, at least a portion of a SONOS dual bit memory core array formed upon a semiconductor substrate is disclosed. The memory includes a first insulating layer formed over the substrate, but that is not patterned, a charge trapping layer formed over the first insulating layer, but that is not patterned and a second insulating layer formed over the charge trapping layer, but that is not patterned. The memory also includes a pair of bitlines buried within the substrate, and a channel is defined between the buried bitlines. Pocket implants are also implanted into the substrate. The bitlines cover some of the pocket implants, while some of the pocket implants extend into the channel. The portions of the pocket implants extending into the channel change doping within select portions of the channel.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
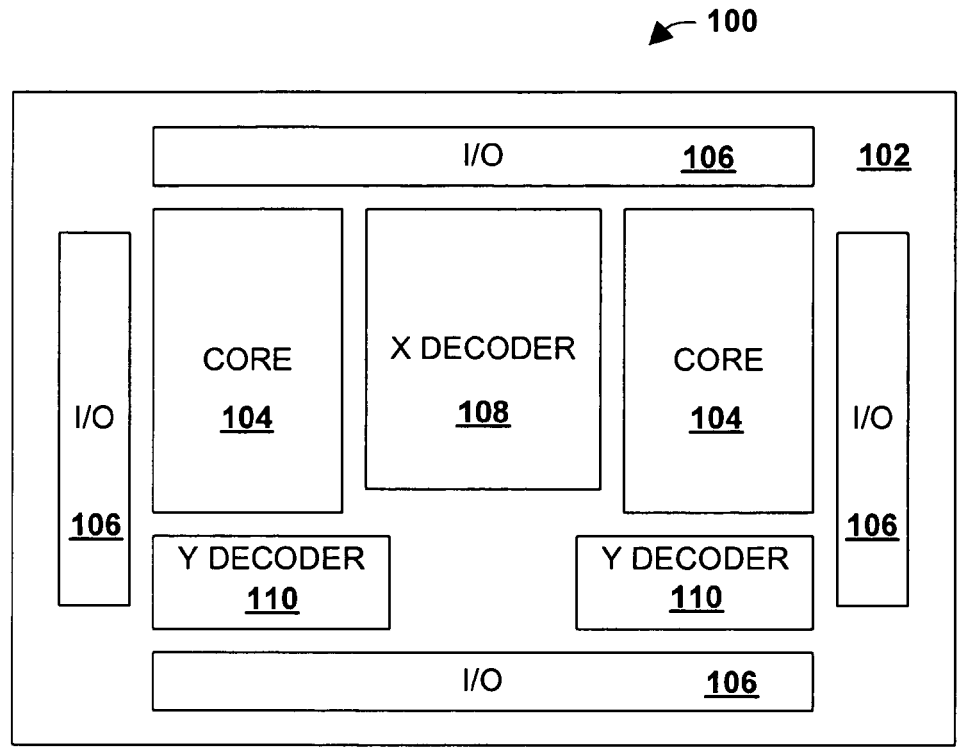
FIG. 1 is a top view of a dual bit flash memory device such as that which may incorporate SONOS technology.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and/or devices are shown in block diagram form in order to facilitate describing one or more aspects of the present invention.

The present invention pertains to utilizing pocket implants in the formation of SONOS type dual bit memory cells suitable for use in storing data for computers and like devices. The pocket implants serve to mitigate, among other things, complementary bit disturb (CBD) that can result from scaling. As such, the devices can be made smaller (e.g., bitlines can be formed closer together) and increased packing densities can be achieved. Two bits stored within a charge trapping layer above a channel defined between two bitlines remain separate and apart so as to not interfere with one another. One bit can thus be operated upon (e.g., programmed, erased or read) without affecting substantially the other bit. Additionally, short channel effects, leakage currents, cross talk, threshold voltage ($V_T$) rolloff as well as other adverse effects that can result from narrow channels are mitigated allowing the memory device to operate as desired. Moreover, the memory cells are formed in a planar process wherein charge trapping dielectric layer(s) are not patterned or etched and thus are created in fewer acts, in less time, with less expense and greater reliability.

Referring initially to FIG. 1, a top view of an exemplary dual bit flash EEPROM 100 that may include SONOS technology is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
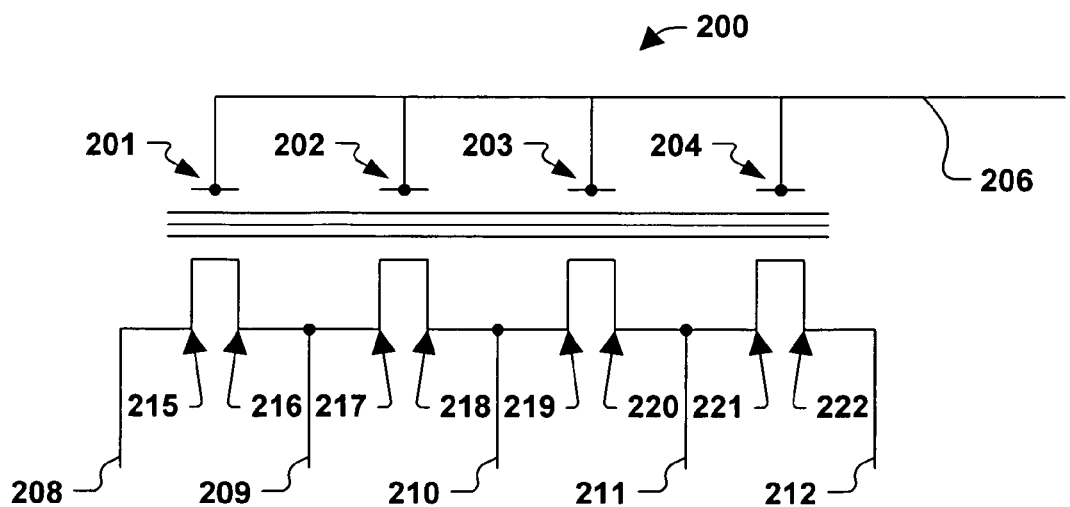
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG.

1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through a signal from the wordline 206 and connection of the drain to the bitline 208 and the source to the bitline 209. Similarly, control of the bit at location 216 is achieved through a signal from the wordline 206 and connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
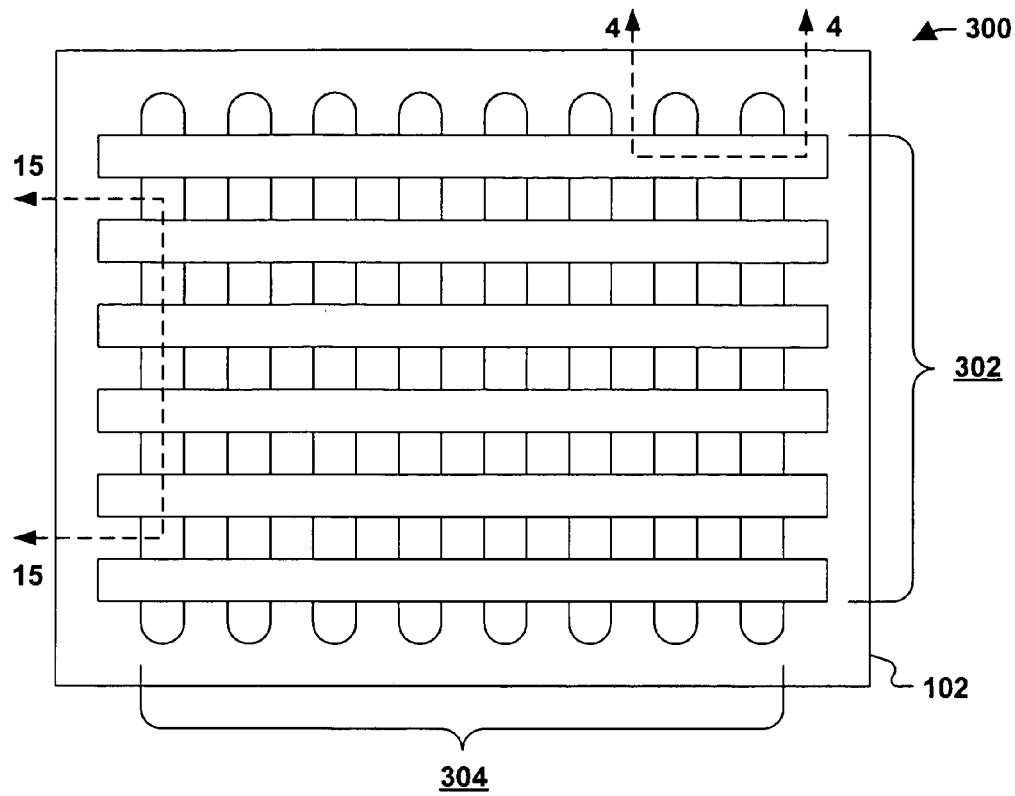
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
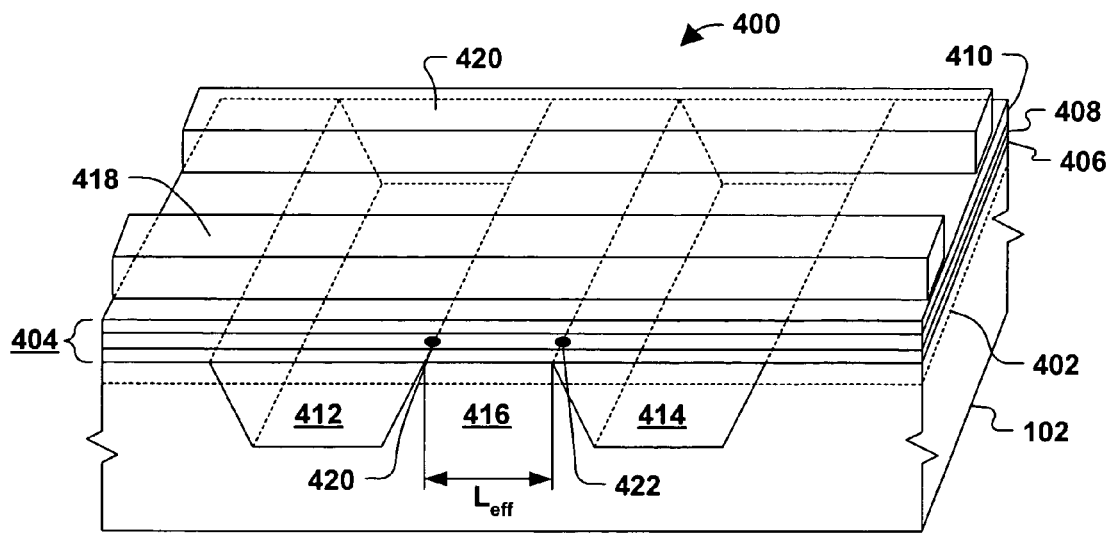
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish an optional threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity, such as Boron. The threshold adjustment implant 402 assists in controlling a threshold voltage of the various cells within the memory 400.

A charge trapping dielectric layer 404 is deposited over the semiconductor substrate 102. The charge trapping dielectric layer 404 generally can be composed of three separate layers: a first insulating layer 406, a charge trapping layer 408, and a second insulating layer 410. The first and second insulating layers 406 and 410 are typically formed of an oxide dielectric such as silicon dioxide ($SiO_2$) and the charge trapping layer 408 is generally formed of a nitride dielectric such as silicon nitride ($Si_xN_y$). The oxide-nitride-oxide configuration is commonly referred to as an ONO layer for convenience. Alternatively, other types of charge trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge trapping dielectric layer 404. It will be appreciated that any number of such wordlines can be formed over the dielectric layer 404, and that such wordlines may correspond to the wordlines 302 depicted in FIG. 3. The wordlines can be formed out of a poly-silicon material, for example, where the poly-silicon material may be deposited over the dielectric layer 404 and then patterned and etched. The entire stack of substrate, ONO layers and the poly-silicon upper layer can be referred to as a SONOS type dual bit memory cell.

Locations 420 and 422 indicate generally where respective bits of data can be stored in one of the cells of the memory 400. It will be appreciated that the channel 416 has an effective length $L_{eff}$ and that the bits 420, 422 will be brought closer together as this length is reduced (e.g., as a result of scaling). As such, complementary bit disturb (CBD) may occur. In particular, the bits themselves may interfere with and/or contaminate one another and operations performed on one bit may affect the other bit should the bits get too close to one another. Accordingly, certain aspects associated with device scaling are undesirable, and a technique for overcoming such disadvantages would be desirable.

Figure 5:
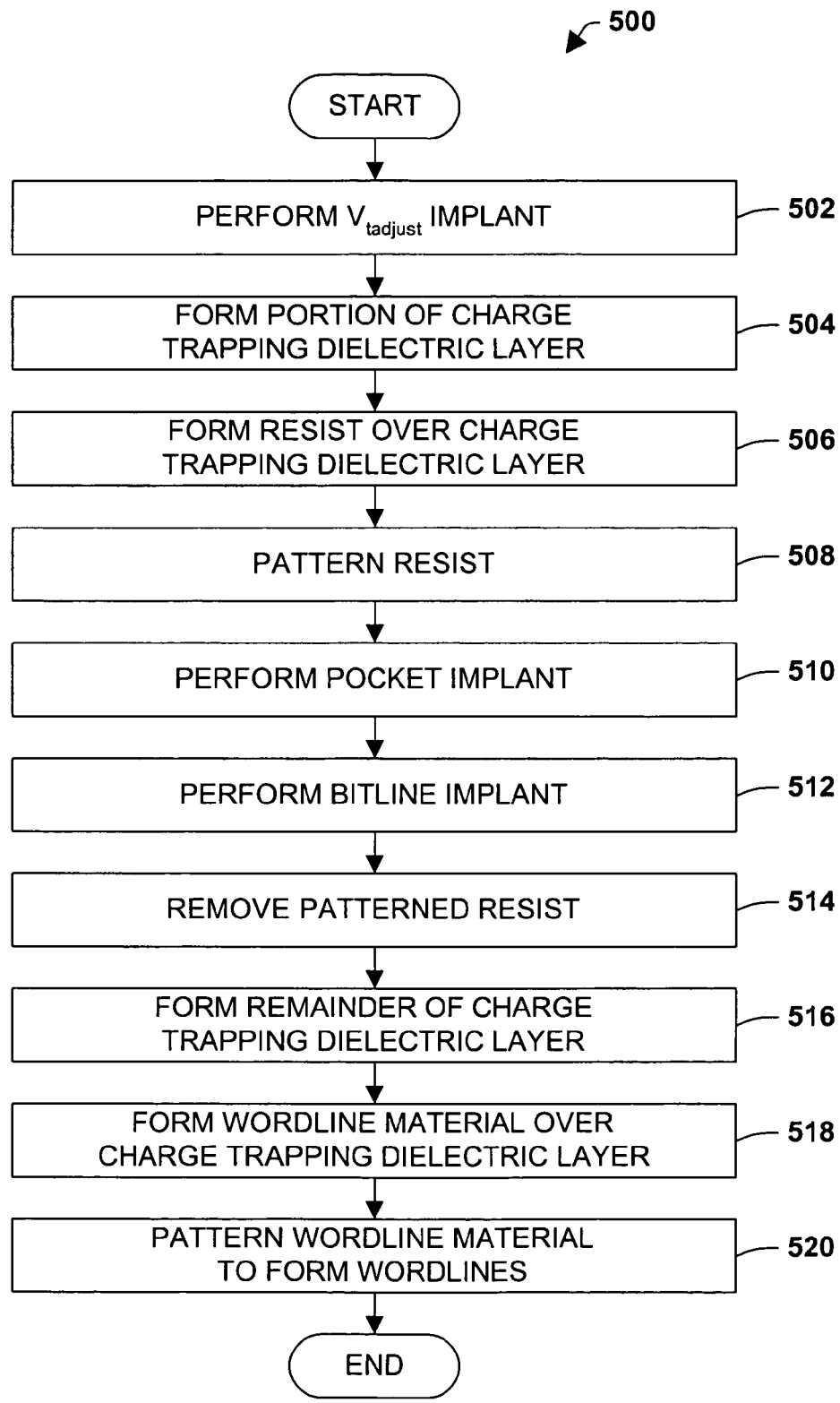
FIG. 5 is a flow diagram illustrating an example of a methodology for forming a dual bit memory device in accordance with one or more aspects of the present invention wherein pocket implants are utilized to mitigate, among other things, complementary bit disturb (CBD) and short channel effects.

Turning to FIG. 5, a methodology 500 is illustrated for forming a memory device according to one or more aspects of the present invention. In particular, the memory is formed utilizing pocket implants that mitigate, among other things, short channel effects and complementary bit disturb (CBD). The memory device so formed may, for example, correspond to a portion of a memory core utilizing SONOS technology such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6–15, as well as to devices not shown or described herein.

The memory is formed upon a semiconductor substrate and at 502 an optional threshold adjustment implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The optional threshold adjustment implant may include a greater concentration of the same or different p-type dopant utilized in the rest of the substrate, for example, to assist with controlling a threshold voltage of the memory device.

At 504 a portion of a charge trapping dielectric layer is formed over the semiconductor substrate. This portion of a charge trapping dielectric layer includes a first insulating layer and a charge trapping layer. The first insulating layer may be formed of an oxide dielectric such as silicon dioxide ($SiO_2$), for example, and the charge trapping layer may be formed of a nitride dielectric such as silicon nitride ($Si_xN_y$), for example. The first insulating layer can be formed to a thickness of about 70 Angstroms or less, for example, while the charge trapping layer can be formed to a thickness between about 60 to 80 Angstroms.

A layer of resist material is then formed over the charge trapping dielectric layer 506. The resist is a radiation-sensitive film of material that can be applied to a thickness of between about 400 to 800 Angstroms, for example, and fixed onto the charge trapping dielectric layer (e.g., via baking). The resist is then patterned at 508. In particular, an exposing source (e.g., light, x-rays, an electron beam) can be utilized to illuminate selected areas of the surface of the film through an intervening master template (e.g., a mask or reticle) to transfer a pattern formed within the template onto resist.

More particularly, light projected onto the resist layer during photolithography changes properties (e.g., solubility) of the layer of material such that different portions thereof (e.g., the illuminated or un-illuminated portions, depending upon the type of resist utilized) can be manipulated in subsequent processing steps. For example, regions of a negative resist become insoluble when illuminated by an exposure source such that the application of a solvent to the resist during a subsequent development stage removes only non-illuminated regions of the resist. The pattern formed in the negative resist layer is, thus, the negative of the pattern defined by opaque regions of the template. By contrast, in a positive resist, illuminated regions of the resist become soluble and are removed via application of a solvent during development. Thus, the pattern formed in the positive resist is a positive image of opaque regions on the template.

The lithographic coating is thus a radiation-sensitized coating suitable for receiving a projected image of the subject pattern. Once the image from the intervening master template is projected onto the resist, it is indelibly formed therein. An optional antireflective coating (ARC) (e.g., of an organic material, such as silicon nitride or silicon oxynitride) can also be formed along with the resist to mitigate reflection during exposure and thereby improve the fidelity of pattern transfer. Features formed out of the resist, and more particularly apertures between such features, correspond to bitlines which will be formed within the substrate.

At 510, pocket implants are formed within the substrate. More particularly, respective pocket regions are formed via implantation of one or more dopants at an angle with respect to the surface of the substrate. The dopants pass through the apertures formed between the resist features and are implanted adjacent to and to a certain degree under the resist features depending upon the angle of implantation. The dopants can, for example, be implanted at an angle of between about 5 to 40 degrees relative to the surface of the substrate and can include one or more p-type dopants, such as boron, for example. Such dopants can also be implanted at an energy level of between about 10 to 100 KeV and a dose of between about 1E12 and 5E14 atoms/cm$^2$, for example.

A bitline implant is then performed at 512 to establish the buried bitlines within the semiconductor substrate. The bitline implant can include one or more n-type dopants (e.g., arsenic, phosphorous and/or antimony) and can be performed at a dose of between about 0.75E15 and 4E15 atoms/cm$^2$ at an energy level of between about 40 to 100 KeV, for example. It will be appreciated, however, that any suitable implant compositions and concentrations are contemplated as falling within the scope of the present invention. Further, in addition to n-type bitline implants, any suitable p-type dopants are also contemplated as falling within the scope of the present invention. The buried bitlines act as respective sources and drains for corresponding memory cells. As such, respective channels are defined between corresponding pairs of buried bitlines.

The pocket implants (or halo implants) create localized dopant distributions near source/drain (S/D) regions defined by the implanted bitlines. Since the dopants are implanted at an angle, the distributions extend, at least partially, into respective channels. As such, the pocket implants mitigate unwanted source/drain leakage conduction, or surface punchthrough current. The pocket implants also serve to mitigate, among other things, short channel effects and complementary bit disturb (CBD). More particularly, one bit can be operated upon (e.g., programmed, erased or read) with little to no affect to the other (mirror) bit. Additionally, leakage currents, cross talk, threshold voltage ($V_T$) rolloff as well as other adverse effects that can result from narrow channels are also thereby mitigated. It will be appreciated that the bitline implants can be performed prior to performing the pocket implants.

The patterned resist is then removed (e.g., stripped away) at 514, and the remainder of the charge trapping dielectric layer is formed at 516 (e.g., to a thickness of about 100 Angstroms or less). As with the first insulating layer, this second insulating layer can be formed of an oxide dielectric such as silicon dioxide ($SiO_2$). It will be appreciated that the oxide-nitride-oxide configuration is commonly referred to as an ONO layer for convenience. It will also be appreciated that materials having a high dielectric constant (high-k materials) can also be used as one or more of the ONO layers, and in particular the first and/or second insulating layers. Aluminum oxide can, for example, but utilized for the second insulating layer.

A layer of wordline material is then formed over the ONO layer at 518. The wordline material can, for example, include poly-silicon. Finally, the wordline material is patterned at 520 to establish wordlines over the buried bitlines (e.g., as depicted in FIGS. 3 and 4). The methodology may then continue on for further back-end processing. It will be appreciated that the present invention contemplates forming the entire ONO layer prior to performing the pocket and bitline implants at 510 and 512, respectively. In this manner, the pocket and bitline implants would be performed through the entire ONO layer, rather than merely the first insulating layer and the charge trapping layer.

Figure 6:
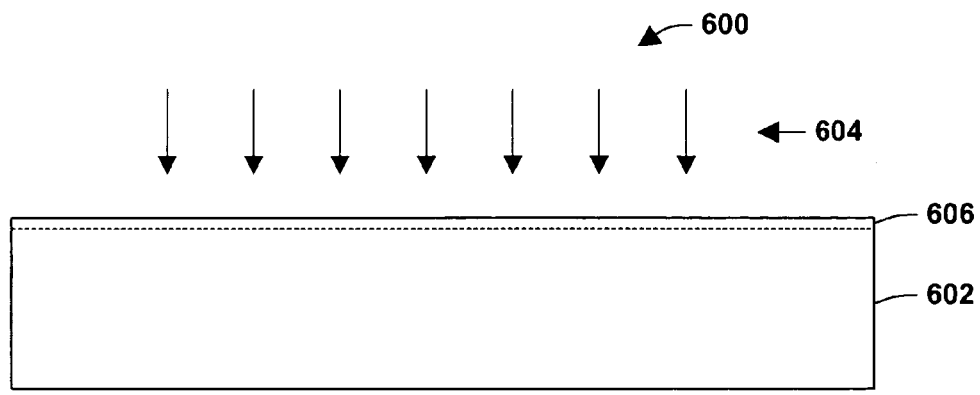
FIGS. 6–15 are cross-sectional illustrations of a dual bit memory device formed according to one or more aspects of the present invention.

Turning now to FIGS. 6–15, an exemplary technique for forming a memory device 600 according to one or more aspects of the present invention is disclosed (FIG. 6). In particular, the memory 600 is formed utilizing pocket implants that mitigate, among other things, short channel effects and complementary bit disturb (CBD). The memory

600 so formed may, for example, correspond to a portion of a memory core utilizing SONOS technology such as may include at least part of one of the M by N array cores depicted in FIG. 1. Scaling and resultant enhanced packing density are thereby facilitated via the use of the pocket implants.

Initially, a semiconductor substrate 602 upon which the memory 600 is formed is subjected to an optional threshold adjustment implant 604 to establish a region 606 in the core of the substrate 602 that is more heavily doped than the remainder of the semiconductor substrate (FIG. 6). The substrate may itself be doped with a p-type dopant such as boron, for example, and the optional threshold adjustment implant ($V_{tadjust}$) may include a greater concentration of the same or different p-type dopant, for example. The threshold adjustment implant 606 assists in controlling a threshold voltage of the memory device 600. The threshold adjustment implant, however, is optional and may be skipped in accordance with the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
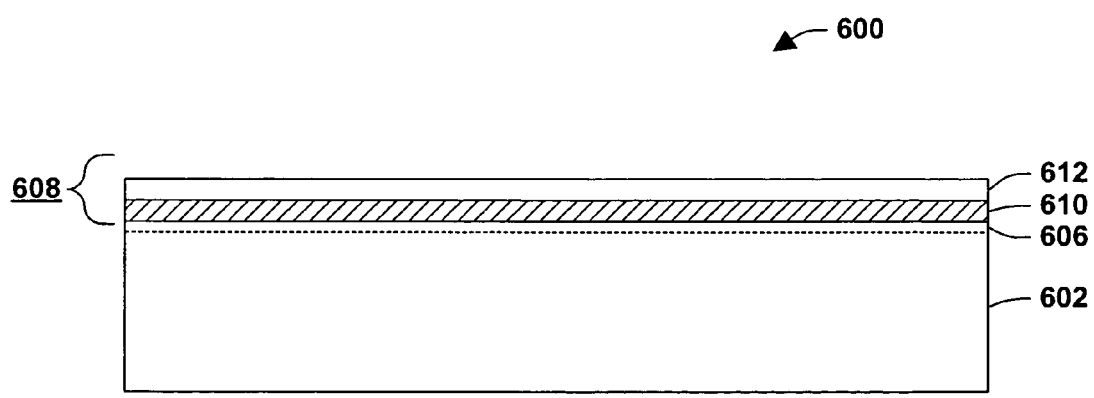
Figure 8:
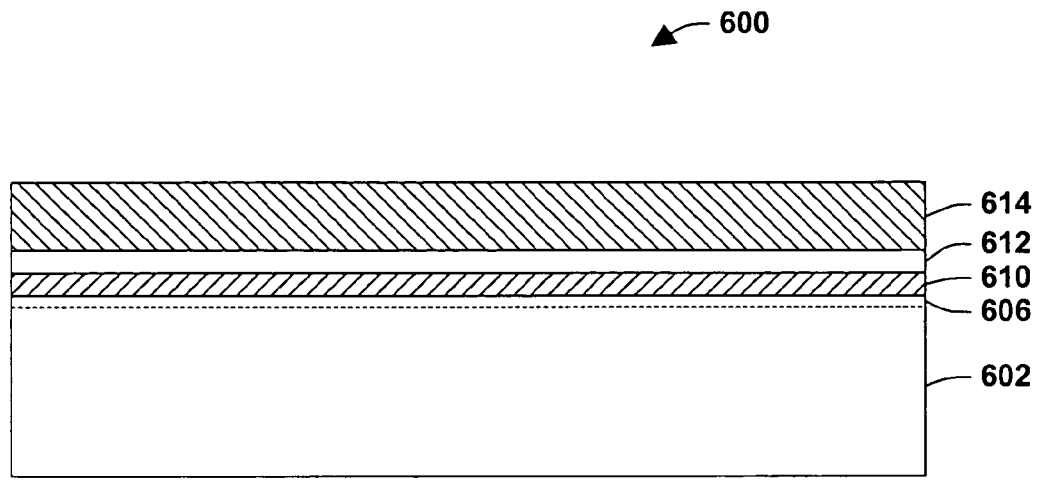

A portion of a charge trapping dielectric layer 608 is then formed over the semiconductor substrate (FIG. 7). This portion of a charge trapping dielectric layer 608 includes a first insulating layer 610 and a charge trapping layer 612. A layer 614 of resist material is then formed over the charge trapping layer 612 (FIG. 8). The resist 614 is a radiation-sensitive film of material that can be applied to a thickness of between about 400 to 800 Angstroms, for example, and fixed onto the charge trapping layer 612 (e.g., via baking).

Figure 9:
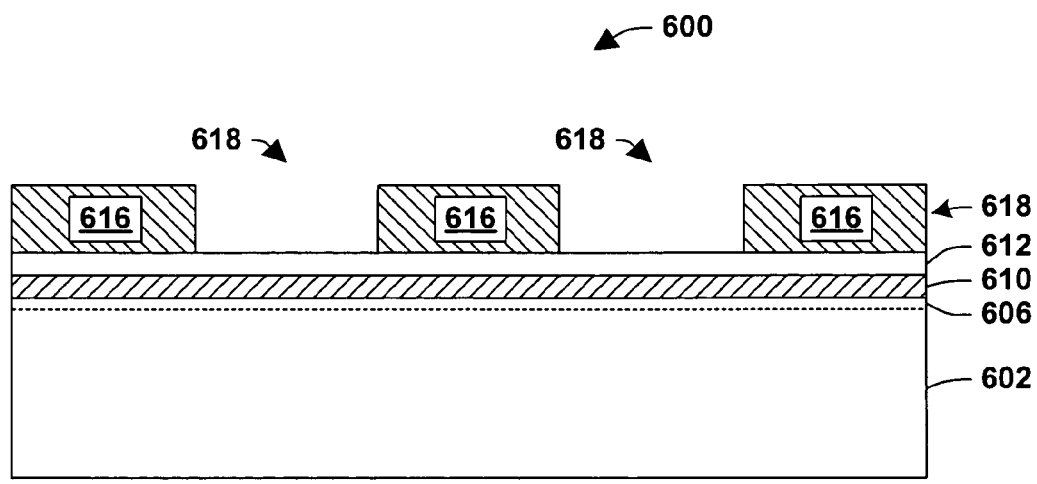

The resist 614 is then patterned, such as by selective exposure to a source of radiation (e.g., light, x-rays, an electron beam) that can be utilized to illuminate particular areas of the film 614 through an intervening master template (e.g., a mask or reticle) to transfer a pattern formed within the template onto resist 614 (FIG. 9). Once the image from the intervening master template (not shown) is projected onto the resist 614, it is indelibly formed therein. Although not shown, an optional antireflective coating (ARC) (e.g., of an organic material, such as silicon nitride or silicon oxynitride) can also be formed along with the resist to mitigate reflection during exposure and thereby improve the fidelity of pattern transfer. Features 616 formed out of the resist 614, and more particularly apertures 618 between such features 616, correspond to bitlines which will later be formed within the substrate 602.

Figure 10:
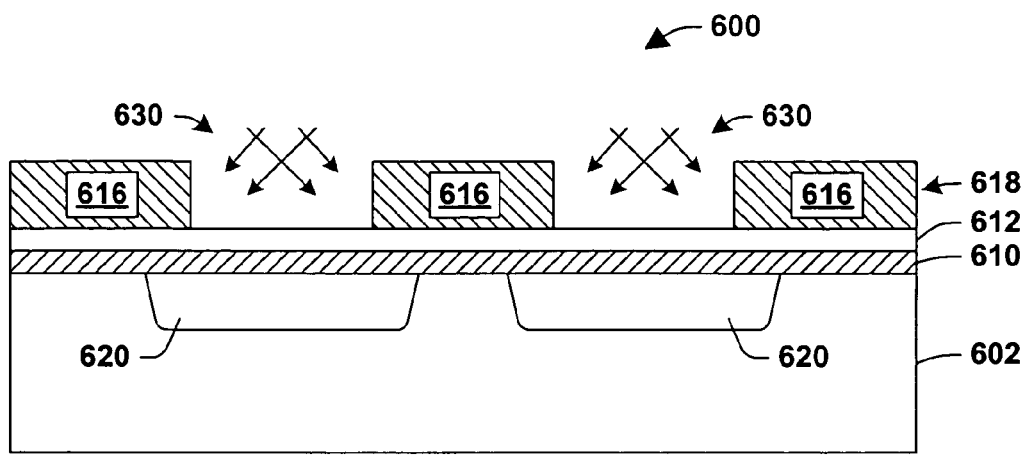

Pocket implants 620 are then formed within the substrate 602 (FIG. 10). More particularly, respective pocket regions are formed via implantation 630 of one or more dopants at an angle with respect to the surface of the substrate 602. The dopants pass through the apertures 618 existing between the resist features 616 and are implanted adjacent to and to a certain degree under portions of the features 616 depending upon the angle of implantation. The dopants can, for example, be implanted at an angle of between about 5 to 40 degrees relative to the surface of the substrate 602 and can include one or more p-type dopants, such as boron, for example. Such dopants can also be implanted at an energy level of between about 10 to 100 KeV and a dose of between about 1E12 and 5E14 atoms/cm$^2$, for example.

Figure 11:
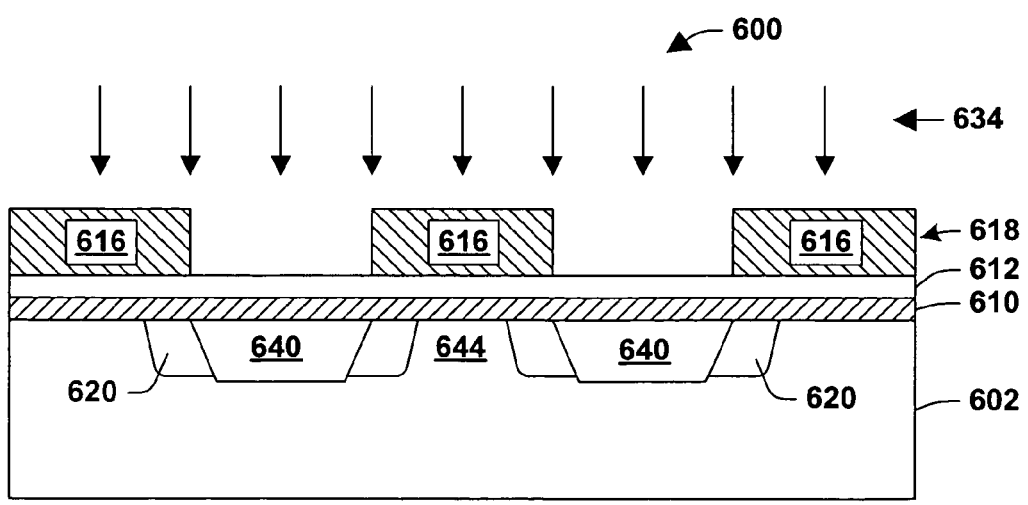
Figure 12:
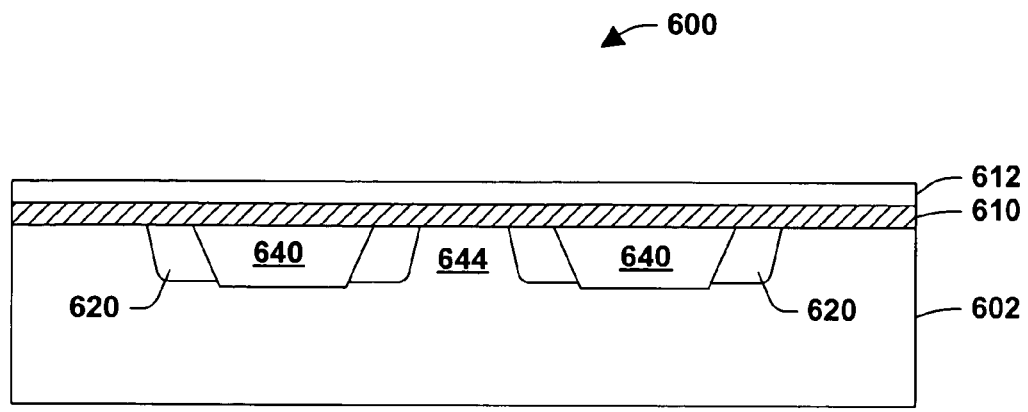

A bitline implant 634 is then performed through the portion of the dielectric 610, 612 to establish the buried bitlines 640 within the semiconductor substrate 602 (FIG. 11). The bitline implant 634 can include one or more n-type dopants (e.g., arsenic, phosphorous, antimony) and can be performed at a dose of between about 0.75E15 and 4E15 atoms/cm$^2$ at an energy level of between about 40 to 100 KeV, for example. It will be appreciated, however, that any suitable implant compositions and concentrations are contemplated as falling within the scope of the present invention, both for the bitlines and pocket implants, as well as any other dopings associated herewith. Further, in addition to n-type bitline implants, any suitable p-type dopants are also contemplated as falling within the scope of the present invention. The buried bitlines 640 act as respective sources and drains for corresponding memory cells. As such, respective channels 644 are defined between corresponding pairs of buried bitlines 640.

Figure 13:
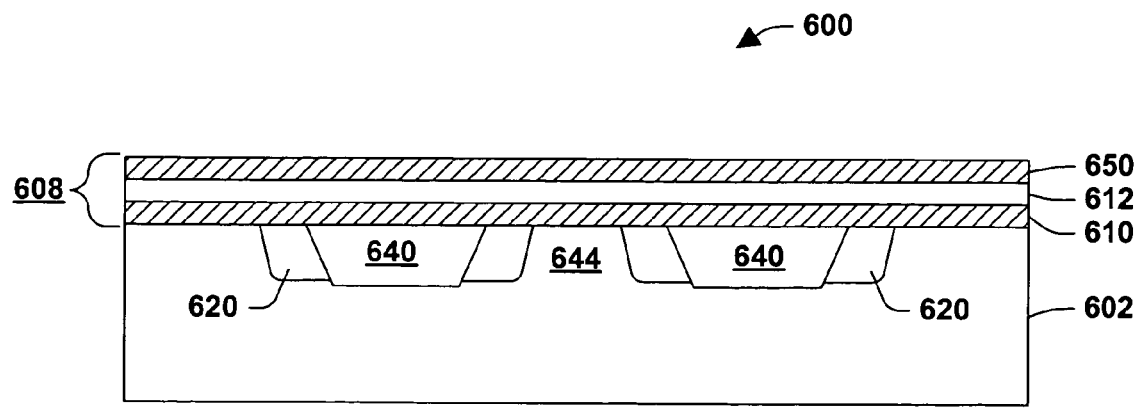

The patterned resist is then removed (e.g., stripped away) (FIG. 12), and the remainder of the charge trapping dielectric layer 608 is formed over the charge trapping layer 612 (FIG. 13). The remainder of the charge trapping dielectric layer can include a second insulating layer 650, for example. It will be appreciated that the first 610 and second 650 insulating layers of the charge trapping dielectric layer 608 can include one or more oxide based materials, while the charge trapping layer 612 of the charge trapping dielectric layer 608 can include one or more nitride based materials. As such the charge trapping dielectric layer can be referred to as an ONO layer.

It is to be appreciated, however, that the charge trapping dielectric layer 608 can be any dielectric layer or layers that are capable of or facilitate electron trapping. In other words, to facilitate electron trapping, the charge trapping dielectric has a layer with a lower barrier height than the layers sandwiching it (e.g., two layers with relatively higher barrier heights sandwiching a layer with a relatively lower barrier height). In the case of an ONO tri-layer dielectric, for example the oxide layers 610, 650 can have a barrier height of about 3.1 eV, for example, whereas the nitride layer 612 can have a barrier height of about 2.1 eV, for example. In this arrangement, a charge trapping well is created in the middle layer 612.

By way of example, charge trapping dielectric layers can include an ONO tri-layer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like. Although the term SONOS is suggestive of an ONO layer, that term as used herein is intended to encompass nonvolatile memory devices containing any suitable charge trapping dielectric layers, including that described above. In other words, a SONOS type nonvolatile memory device in accordance with that described herein can contain any charge trapping dielectric layer or layers that are capable of or facilitate electron trapping.

Where the charge trapping dielectric layer 608 includes ONO layers, for example, one or both of the first 610 and second 650 insulating layers can include one or more silicon-rich silicon dioxide layers, oxygen-rich silicon dioxide layers, thermally grown or deposited oxide layers and/or nitrided oxide layers, for example. The charge trapping layer 612 can similarly include one or more silicon-rich silicon nitride layers or nitrogen-rich silicon nitride layers formed, for example. Materials having a high dielectric constant (high-k materials) can also be used as one or more of the ONO layers, and in particular the first 610 and/or second 650 insulating layers. Aluminum oxide can also, for example, but utilized for the second insulating layer 650.

In accordance with further examples, the first 610 and second 650 insulating layers can have respective thicknesses of between about 50 Angstroms to about 150 Angstroms, about 60 Angstroms to about 140 Angstroms or about 70 Angstroms to about 130 Angstroms, while the charge trapping nitride layer 612 can have a thickness of between about 20 Angstroms to about 80 Angstroms, about 25 Angstroms to about 75 Angstroms or about 30 Angstroms to about 70 Angstroms.

It is to be appreciated that the present invention contemplates forming the entire ONO layer 608 prior to performing the pocket implants 620 and the bitline implants 634. In this manner, the pocket 620 and bitline 634 implants would be performed through the second insulating layer 650 as well as the charge trapping layer 612 and the first insulating layer 610.

Figure 14:
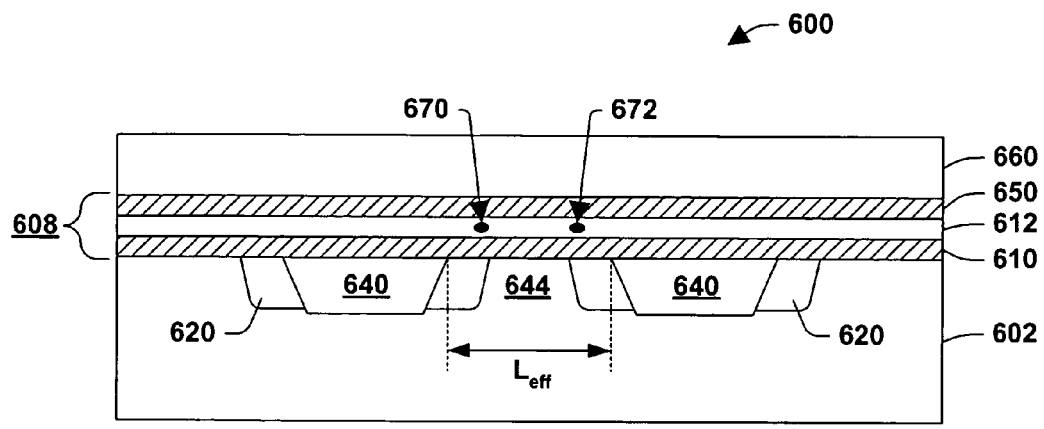
Figure 15:
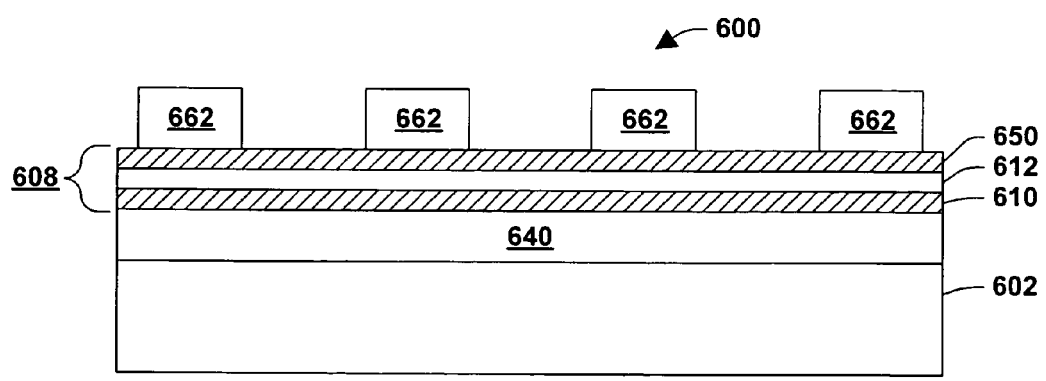

A layer of wordline material 660 is then formed over the second insulating layer 650 (FIG. 14). The wordline material 660 can, for example, include poly-silicon or other type of conductive material. Finally, the wordline material 660 is patterned (e.g., etched) to establish wordlines 662 over the buried bitlines (FIG. 15) to illustrate the plurality of wordlines formed after patterning thereof. It will be appreciated that FIG. 15 may correspond to the device depicted in FIG. 3 taken along lines 15—15. Accordingly, the illustration depicted in FIG. 15 is rotated 90 degrees relative to the images illustrated in FIGS. 6–14. As such, a side view or view along the length of a buried bitline 640 is illustrated in FIG. 15. Also, it will be appreciated that the buried bitlines 640 and the wordlines 662 are oriented at substantially right angles relative to one another.

It will be appreciated that the pocket implants (or halo implants) 620 create localized dopant distributions near source/drain (S/D) regions defined by the implanted bitlines 640. Since the dopants are implanted at an angle, the distributions extend, at least partially, into respective channels 644 defined between the bitlines 640 (FIGS. 11–14). As such, the pocket implants 620 mitigate unwanted source/drain leakage conduction, or surface punchthrough current.

The pocket implants 620 also serve to mitigate, among other things, short channel effects and complementary bit disturb (CBD). More particularly, where multiple bits 670, 672 are stored within the charge trapping layer 612 above the channel 644, one bit can be operated upon (e.g., programmed, erased or read) with little to no affect to the other (mirror) bit (FIG. 14). Additionally, leakage currents, cross talk, threshold voltage ($V_T$) rolloff as well as other adverse effects that can result from narrow channels are also thereby mitigated. As such, one or more aspects of the present invention allow an effective length ($L_{eff}$) of the channel 644 to be reduced, where the effective length of the channel is the length at which stored bits, such as bits 670, 672 are sufficiently isolated from one another such that the bits do not disturb one another and one bit remains substantially unaffected when the other bit is acted upon (e.g., a read, write or erase operation) (FIG. 14). This allows more bits of information to be stored within a smaller area of memory. Accordingly, packing density can be enhanced while device performance is maintained.

It is to be appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example. It is to be further appreciated that the ordering of the acts set forth herein are not absolute. For example, the bitlines 640 can be formed prior to forming the pocket implants 620.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a SONOS dual bit memory core array upon a semiconductor substrate, the method comprising:

forming a portion of a charge trapping dielectric layer over the substrate;

forming a resist over the portion of the charge trapping dielectric layer;

patterning the resist to form a plurality of resist features having respective first spacings therebetween;

performing a pocket implant through the first spacings and the portion of the charge trapping dielectric layer, the pocket implant performed at an angle relative to the semiconductor substrate so as to establish pocket implants within the substrate that extend at least partially under the resist features;

performing a bitline implant through the first spacings and the portion of the charge trapping dielectric layer to establish buried bitlines within the substrate having a width corresponding generally to the first spacing, the bitlines not covering the portions of the pocket implants that extend under the resist features, wherein the bitline implant is performed before the pocket implant;

removing the patterned resist;

forming the remainder of the charge trapping dielectric layer over the portion of the charge trapping dielectric layer;

forming a wordline material over the remainder of the charge trapping dielectric layer; and patterning the wordline material to form wordlines that overlie the bitlines.

2. The method of claim 1, wherein a channel is defined between two buried bitlines, the portions of pocket implants extending under the resist features changing doping within select portions of the channel.

3. The method of claim 1, wherein forming a portion of a charge trapping dielectric layer comprises:

forming a first insulating layer over the semiconductor substrate; and forming a charge trapping layer over the first insulating layer.

4. The method of claim 3, wherein forming the remainder of the charge trapping dielectric layer comprises:

forming a second insulating layer over the charge trapping layer.

5. The method of claim 4, wherein the first and second insulating layers comprise at least one of one or more silicon-rich silicon dioxide layers, one or more oxygen-rich silicon dioxide layers, one or more thermally grown or deposited oxide layers, materials having a high dielectric constant and one or more nitrided oxide layers.

6. The method of claim 4, wherein the charge trapping layer comprises at least one of one or more silicon-rich silicon nitride layers and one or more nitrogen-rich silicon nitride layers.

7. The method of claim 4, wherein the first insulating layer is formed to a thickness of about 70 Angstroms or less.

8. The method of claim 4, wherein the charge trapping layer is formed to a thickness of between about 60 to 80 Angstroms.

9. The method of claim 4, wherein the second insulating layer is formed to a thickness of about 100 Angstroms or less.

10. A method of forming at least a portion of a SONOS dual bit memory core array upon a semiconductor substrate, the method comprising:

forming a portion of a charge trapping dielectric layer over the substrate;

forming a resist over the portion of the charge trapping dielectric layer patterning the resist to form a plurality of resist features having respective first spacings therebetween;

performing a pocket implant through the first spacings and the portion of the charge trapping dielectric layer, the pocket implant performed at an angle relative to the semiconductor substrate so as to establish pocket implants within the substrate that extend at least partially under the resist features, wherein the pocket implant includes boron and is performed at an angle of between about 5 to 40 degrees relative to the substrate;

performing a bitline implant through the first spacings and the portion of the charge trapping dielectric layer to establish buried bitlines within the substrate having a width corresponding generally to the first spacing, the bitlines not covering the portions of the pocket implants that extend under the resist features, wherein the bitline implant includes at least one of arsenic, phosphorous and antimony;

removing the patterned resist;

forming the remainder of the charge trapping dielectric layer over the portion of the charge trapping dielectric layer;

forming a wordline material over the remainder of the charge trapping dielectric layer; and patterning the wordline material to form wordlines that overlie the bitlines.

11. The method of claim 10, wherein the bitline implant is performed at a dose of between about 0.75E15 and 4E15 atoms/cm$^2$.

12. The method of claim 11, wherein the bitline implant is performed at an energy level of between about 40 to 100 KeV.

13. The method of claim 1, wherein the wordlines are oriented at substantially right angles relative to the buried bitlines.

14. The method of claim 1, wherein the pocket implant is performed at an energy level of between about 10 to 100 KeV.

15. The method of claim 1, wherein the pocket implant is performed at a dose of between about 1E12 and 5E14 atoms/cm$^2$.

16. A method of forming at least a portion of a SONOS dual bit memory core array upon a semiconductor substrate, the method comprising:

forming a portion of a charge trapping dielectric layer over the substrate;

forming a resist over the portion of the charge trapping dielectric layer patterning the resist to form a plurality of resist features having respective first spacings therebetween;

performing a pocket implant through the first spacings and the portion of the charge trapping dielectric layer, the pocket implant performed at an angle relative to the semiconductor substrate so as to establish pocket implants within the substrate that extend at least partially under the resist features;

performing a bitline implant through the first spacings and the portion of the charge trapping dielectric layer to establish buried bitlines within the substrate having a width corresponding generally to the first spacing, the bitlines not covering the portions of the pocket implants that extend under the resist features;

removing the patterned resist;

forming the remainder of the charge trapping dielectric layer over the portion of the charge trapping dielectric layer;

forming a wordline material over the remainder of the charge trapping dielectric layer;

patterning the wordline material to form wordlines that overlie the bitlines; and performing a threshold adjustment implant into the semiconductor substrate prior to forming the portion of the charge trapping dielectric layer.

17. The method of claim 16, wherein the threshold adjustment implant includes boron.

18. A method of forming at least a portion of a SONOS dual bit memory core array upon a semiconductor substrate, the method comprising:

forming pocket implants within the substrate without patterning a first insulating layer overlying the substrate or a charge trapping layer overlying the first insulating layer, the pocket implants being implanted at least partially under features formed out a resist material overlying the charge trapping layer and through the first insulating layer, the charge trapping layer and first spacings formed between the resist features;

forming bitline implants through the first spacings to establish buried bitlines within the substrate having respective widths corresponding generally to the first spacings, the bitlines not covering the portions of the pocket implants that extend under the resist features, wherein the bitline implant is performed before the pocket implant;

removing the resist features;

forming a second insulating layer over the charge trapping layer;

forming a wordline material over the second insulating layer; and patterning the wordline material to form wordlines that overlie the bitlines.

19. The method of claim 18, wherein the first and second insulating layers comprise at least one of one or more silicon-rich silicon dioxide layers, one or more oxygen-rich silicon dioxide layers, one or more thermally grown or deposited oxide layers and one or more nitrided oxide layers.

20. The method of claim 18, wherein the charge trapping layer comprises at least one of one or more silicon-rich silicon nitride layers and one or more nitrogen-rich silicon nitride layers.

21. The method of claim 18, wherein the pocket implants are formed at an angle of between about 5 to 40 degrees relative to the substrate.

22. The method of claim 18, wherein the pocket implants are formed at an energy level of between about 10 to 100 KeV and a dose of between about 1E12 and 5E14 atoms/cm$^2$.

23. The method of claim 18, wherein the pocket implants are formed at a dose of between about 1E12 and 5E14 atoms/cm$^2$.

* * * * *